(12) United States Patent
Chen et al.

(10) Patent No.: US 8,243,458 B2
(45) Date of Patent: Aug. 14, 2012

(54) WATERPROOF STRUCTURE FOR PORTABLE ELECTRONIC DEVICE

(75) Inventors: Jian-Hui Chen, Shenzhen (CN); Ming-Zhi Zheng, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 224 days.

(21) Appl. No.: 12/766,207

(22) Filed: Apr. 23, 2010

(65) Prior Publication Data

US 2011/0051383 A1 Mar. 3, 2011

(30) Foreign Application Priority Data

Aug. 31, 2009 (CN) .......................... 2009 1 0306362

(51) Int. Cl.
*H05K 5/00* (2006.01)

(52) U.S. Cl. .......................... 361/752; 361/792; 361/728

(58) Field of Classification Search .................. 361/728, 361/752, 807, 810, 730, 792, 796, 800; 455/575.1–575.4, 575.7

See application file for complete search history.

(56) References Cited

U.S. PATENT DOCUMENTS

| | | | |
|---|---|---|---|
| 6,942,153 B1 * | 9/2005 | Yuan et al. | 235/472.01 |
| 7,006,355 B2 * | 2/2006 | Wakabayashi et al. | 361/728 |
| 7,663,878 B2 * | 2/2010 | Swan et al. | 361/679.56 |
| 2009/0245564 A1 * | 10/2009 | Mittleman et al. | 381/361 |
| 2009/0277662 A1 * | 11/2009 | Shiue | 174/50.51 |

\* cited by examiner

*Primary Examiner* — Hung S Bui
(74) *Attorney, Agent, or Firm* — Altis Law Group, Inc.

(57) ABSTRACT

A waterproof structure for a portable electronic device includes a housing, an interface member, a waterproof circuit board, a chamber, and a main circuit board. The housing has a bottom wall and a peripheral wall around the bottom wall, the bottom wall has an enclosure formed thereon, the peripheral wall defines a connecting hole through to the enclosure. The interface member has an interconnect inlet, the interface member is placed into a chamber, the interconnect inlet aligns with the connecting hole, the waterproof circuit board engages in the enclosure to prevent vapors or dust enter into the main circuit board, the waterproof circuit board also electronically connect the main circuit board.

19 Claims, 3 Drawing Sheets

WATERPROOF STRUCTURE FOR PORTABLE ELECTRONIC DEVICE

BACKGROUND

1. Technical Field

The present disclosure relates to waterproof structures, particularly, to a waterproof structure for portable electronic device such as portable telephones.

2. Description of Related Art

Electronic devices usually define various holes in their housings to allow connection of peripheral devices such as earphones, external loudspeakers and so on. These holes have interface elements connected to electronically connect the peripheral devices to the components assembled within the electronic device. However, contaminants such as dust may pass through the hole into the inside of the electronic device and degrade performance of or damage the device.

Waterproof structures such as rubber, gaskets are usually applied in the electronic device. However, the waterproof structures are difficult to install and require positioning space as well and if distorted in any way defeat the waterproofing function.

Therefore, there is a room for improvement within the art.

BRIEF DESCRIPTION OF THE DRAWINGS

Many aspects of waterproof structure for portable electronic device can be better understood with reference to the following drawings. The components in the drawings are not necessarily to scale, the emphasis instead being placed upon clearly illustrating the disclosure. Moreover, in the drawings, like reference numerals designate corresponding parts throughout the several views.

DETAILED DESCRIPTION

Figure 1:
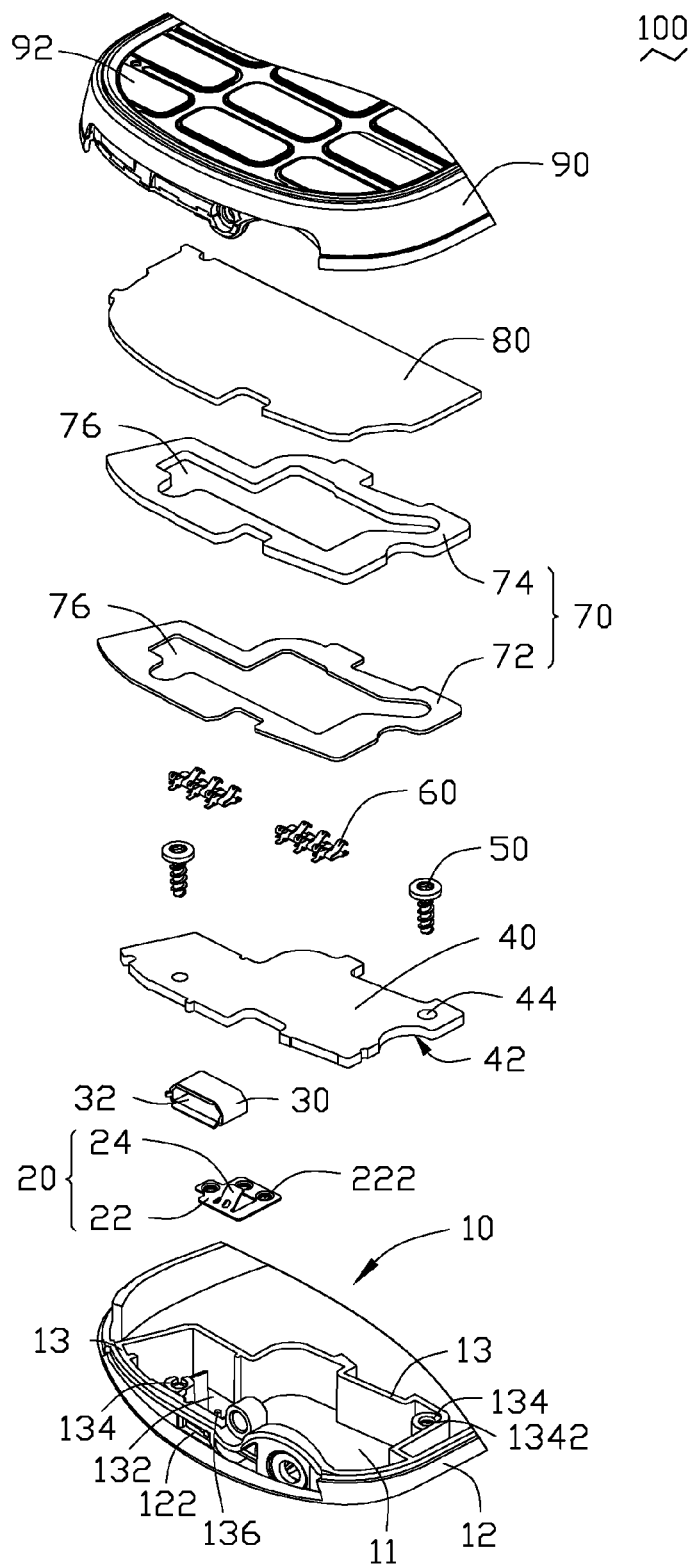
FIG. 1 is an exploded, isometric view of a waterproof structure for portable electronic device according to an exemplary embodiment.

FIG. 1 shows an exemplary waterproof structure 100 for portions of an electronic device, such as mobile phone, personal digital assistant, and so on. The waterproof structure 100 includes a housing 10, a supporting member 20, an interface member 30, a waterproof circuit board 40, a conducting member 60, a sealing assembly 70, a main circuit board 80, fixing members 50, and a cover 90.

The housing 10 includes a bottom wall 11, a peripheral wall 12 around the bottom wall 11, and an enclosure 13 formed on the bottom wall 11. The enclosure 13 has a portion abutting the inner side of the peripheral wall 12. The peripheral wall 12 is ridged to engage the cover 90. A connecting hole 122 is defined through the peripheral wall 12 and the enclosure 13. The enclosure 13 is lower than the peripheral wall 12. The enclosure 13 encloses a chamber 132. The chamber 132 has two connecting posts 134 and some fixing posts 136 formed therein. The connecting posts 134 axially define a threaded hole 1342 therein to engage the fixing member 70. The fixing posts 136 secure the supporting member 20 and support the interface member 30.

The supporting member 20 includes a base plate 22 and an elastic sheet 24 extending, e.g., angularly, relative to the base plate 22. The base plate 22 defines a plurality of fixing holes 222 to receive the fixing posts 136 therein. The elastic sheet 24 elastically resists against the interface member 30.

The interface member 30 can be made of conductive materials and includes an interconnect inlet 32. The interface member 30 is received in the chamber 132 and the interconnect inlet 32 aligns with the connecting hole 122 of the peripheral wall 12.

The waterproof circuit board 40 corresponds to the enclosure 13 and engages in the enclosure 13. The waterproof circuit board 40 has a waterproof layer 42 comprised of material such as waterproof ink coated on the bottom surface. The waterproof circuit board 40 defines two through holes 44 corresponding to the connecting posts 134 of the housing 10. The through hole 44 and the threaded hole 1342 engage with the fixing member 50, such as a screw, to secure the waterproof circuit board 40.

The conducting member 60 is elastic and electrically connects the waterproof circuit board 40 to the main circuit board 80.

The sealing assembly 70 is used to seal any gaps between the waterproof circuit board 40 and the enclosure 13. The sealing assembly 70 includes an adhesive layer 72 and a gasket 74 corresponding to the adhesive layer 72 in shape. The adhesive layer 72 can be made of glue, and the gasket 74 can be made of sponge-like material. The sealing assembly 70 defines a through space 76 through the adhesive layer 72 and the gasket 74. The through space 76 facilitates extension of the conducting member 60 through the sealing assembly 70.

The main circuit board 80 can be received in the housing 10 and covers the enclosure 13. The main circuit board 80 electronically connects with the interface member 30 by the waterproof circuit board 40 and the conducting member 60.

The cover 90 has keys 92 on the top surface and is engageable with the housing 10. The waterproof circuit board 40, the conducting member 50, the sealing assembly 60, and the main circuit board 70 are positioned between the cover 90 and the housing 10.

Figure 2:
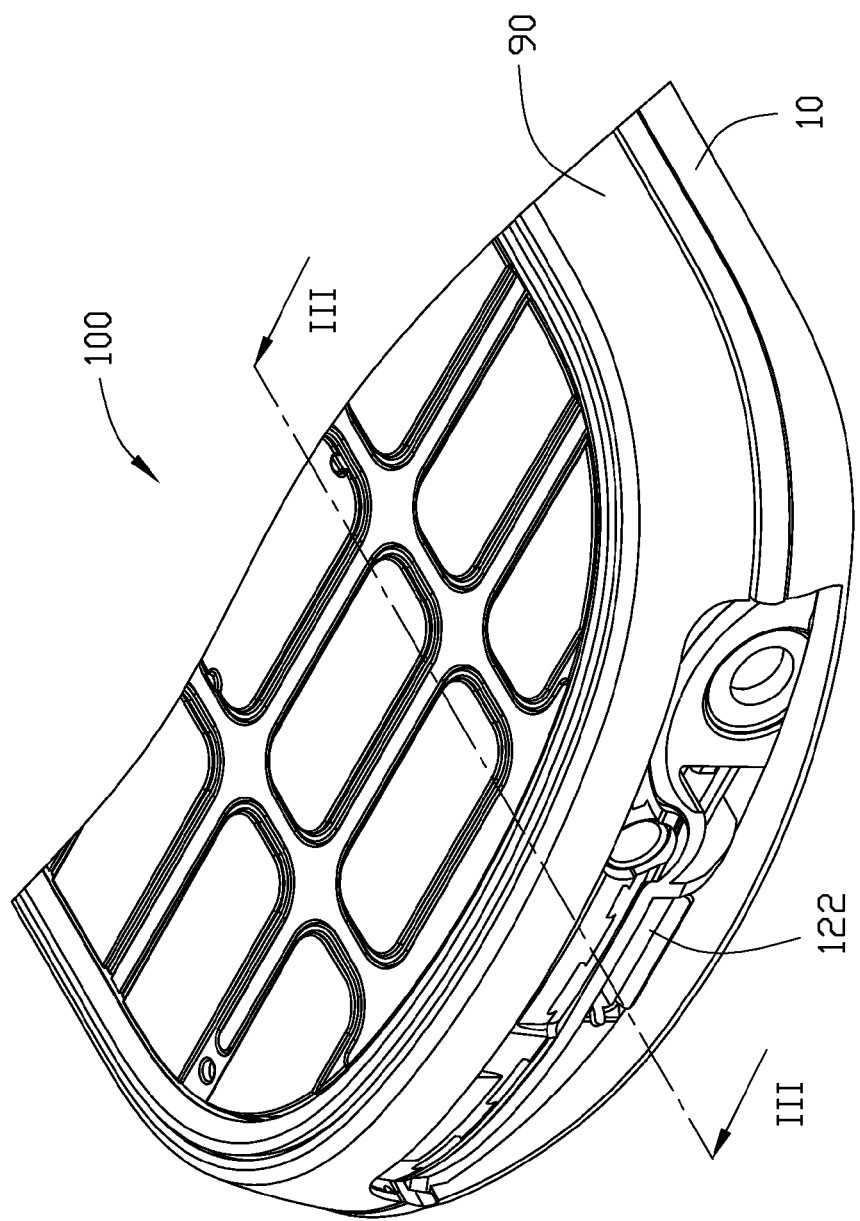
FIG. 2 is an assembled, isometric view of the waterproof structure shown in FIG. 1.
Figure 3:
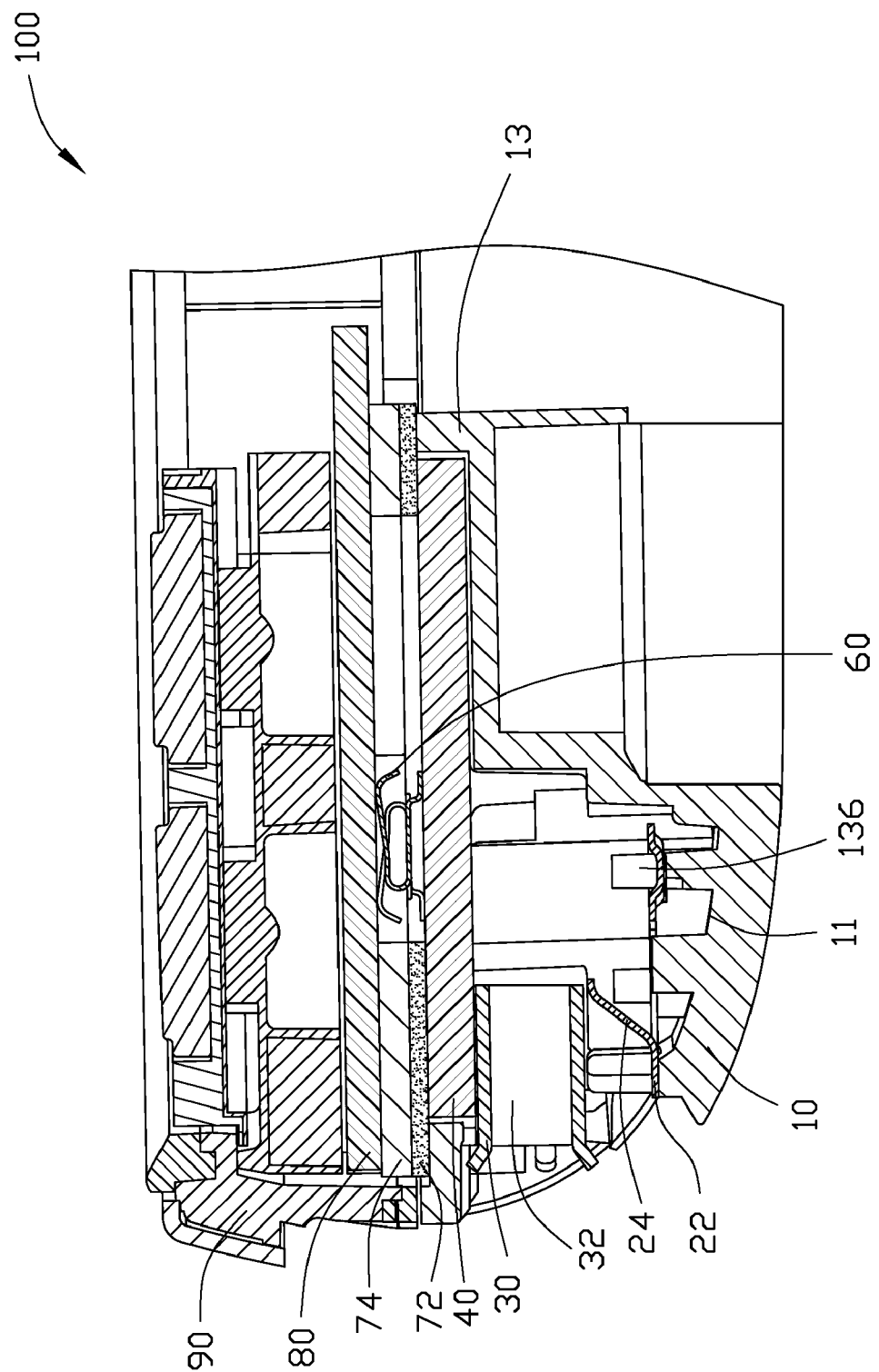
FIG. 3 is a cross-sectional view of the waterproof structure taken along line III-III of FIG. 2.

Referring to FIGS. 2 and 3, during assembling the waterproof structure 100, the supporting member 20 placed on the chamber 132 of the housing 10, the fixing holes 222 of the base plate 22 latches with the fixing posts 136 correspondingly of the housing 10. The interface member 30 positions in the chamber 132 and resists against the supporting member 20. The waterproof circuit board 40 engages in the chamber 132, and the through holes 44 align with the connecting posts 134 of the housing 10. The fixing member 40 passes through the through holes 44 and screws with the threaded hole 1342 of the connecting post 134 to secure the waterproof circuit board 40 with the connecting posts 134. Therefore, the interface member 30 is tightly held between and by the supporting member 20 and the waterproof circuit board 40. The elastic sheet 24 is pressed downwardly, and the interconnect inlet 32 aligns with the connecting hole 122 of the peripheral wall 12. After the assembly of the waterproof circuit board 40, there may be gaps (not shown) between the waterproof circuit board 40 and the enclosure 13. The sealing assembly 70 is installed and the adhesive layer 72 completely covers and seals the gaps, and the gasket 74 correspondingly attaches on the adhesive layer 72. The conducting members 60 are placed on the waterproof circuit board 40, passing through the through space 76 and electronically connecting to the waterproof circuit board 40. The main circuit board 80 is assembled in the housing 10 and resists against the gasket 74. The conducting member 50 is sandwiched between the waterproof circuit board 40 and the main circuit board 80 to electronically connect the waterproof circuit board 40 to the main circuit board 80. The cover 90 engages with the housing 10.

The waterproof structure 100 can be used in a portable electronic device. When the electronic device is used in a wet environment, the waterproof circuit board 40 can prevent moisture entering through the interconnect inlet 32 to the main circuit board 80. When the peripheral electronic component electronically connects the interface member 30, the waterproof circuit board 40 can electronically connect the outer electronic component to the main circuit board 80. In addition, the waterproof circuit board 40 can prevent contaminants such as dust entering through the interconnect inlet 32 into the inside of the electronic device.

It is to be understood that, the waterproof circuit board 40 can be made to envelop the enclosure 13 completely without any gaps, accordingly, the sealing assembly 70 can be omitted.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A waterproof structure for a portable electronic device, comprising:
a housing having a bottom wall and a peripheral wall, the bottom wall having an enclosure formed thereon, the enclosure defining a chamber, the peripheral wall defining a connecting hole communicating with the chamber;
an interface member inside the chamber, the interface member having an interconnect inlet aligning with the connecting hole;
a waterproof circuit board engaging with the enclosure to prevent vapors or dust enter into a main circuit board; and
the main circuit board electronically connecting the waterproof circuit board;
wherein the waterproof structure includes a supporting member, the supporting member placed in the chamber to support the interface member; the supporting member includes a base plate and an elastic sheet extending from the base plate, the base plate defines fixing holes, the enclosure has fixing posts formed therein, the fixing holes correspondingly receives the fixing posts, the elastic sheet resists against the interface member.

2. The waterproof structure as claimed in claim 1, wherein the waterproof structure includes two fixing members, the enclosure has two connecting posts formed therein, each connecting post defines a threaded hole, the waterproof circuit board defines two through holes corresponding to the connecting posts, the waterproof circuit board is received in the chamber, the fixing member passes through the through hole into the threaded hole to secure the waterproof circuit board with the connecting post.

3. The waterproof structure as claimed in claim 2, wherein the sealing assembly includes an adhesive layer and a gasket overlapping on the adhesive layer.

4. The waterproof structure as claimed in claim 3, wherein the conducting member is metallic elastic member, the sealing assembly defines a through space running through the adhesive layer and the gasket, the conducting member placed on the waterproof circuit board and passes through the through space to connect the main circuit board.

5. The waterproof structure as claimed in claim 1, wherein the waterproof structure includes a sealing assembly sealing the gaps formed between the waterproof circuit board and the enclosure.

6. The waterproof structure as claimed in claim 5, wherein the waterproof structure includes a conducting member to electronically connect the waterproof circuit board and the main circuit board.

7. The waterproof structure as claimed in claim 5, wherein the adhesive layer is glue, the gasket is sponge.

8. The waterproof structure as claimed in claim 1, wherein the waterproof structure includes a cover, the cover engages with the housing.

9. The portable electronic device as claimed in claim 8, wherein the portable electronic device includes two fixing members to secure the waterproof circuit board with the enclosure.

10. The portable electronic device as claimed in claim 9, wherein the sealing assembly includes an adhesive layer and a gasket overlapping on the adhesive layer.

11. The portable electronic device as claimed in claim 8, wherein the portable electronic device includes a sealing assembly sealing the gaps formed between the waterproof circuit board and the enclosure.

12. The portable electronic device as claimed in claim 11, wherein the portable electronic device includes a conducting member to electronically connect the waterproof circuit board and the main circuit board.

13. A portable electronic device, comprising:
a housing having a bottom wall and a peripheral wall, the bottom wall having an enclosure formed thereon, the enclosure defining a chamber, the peripheral wall defining a connecting hole communicating with the chamber;
an interface member inside the chamber, the interface member having an interconnect inlet aligning with the connecting hole;
a waterproof circuit board engaging with the enclosure;
a main circuit board electronically connecting the waterproof circuit board;
a cover covering the housing;
wherein the portable electronic device includes a supporting member, the supporting member placed in the chamber to support the interface member; the supporting member includes a base plate and an elastic sheet extending from the base plate, the base plate defines fixing holes, the enclosure has fixing posts formed therein, the fixing holes correspondingly receive the fixing posts, the elastic sheet resists against the interface member.

14. A portable electronic device, comprising:
a housing having a bottom wall and a peripheral wall, the bottom wall having an enclosure formed thereon, the enclosure defining a chamber, the peripheral wall defining a connecting hole communicating with the chamber;
an interface member inside the chamber, the interface member having an interconnect inlet aligning with the connecting hole;
a main circuit board being assembled on the enclosure;
a waterproof circuit board electronically connect the interface member with the main circuit board, wherein the waterproof circuit board is located between the main circuit board and the interface member to separate the main circuit board from the interface member; and
wherein the portable electronic device includes two fixing members to secure the waterproof circuit board with the enclosure.

15. The portable electronic device as claimed in claim 14, wherein the portable electronic device includes a supporting member, the supporting member placed in the chamber to support the interface member.

16. The portable electronic device as claimed in claim 15, wherein the supporting member includes a base plate and an elastic sheet extending from the base plate, the base plate defines fixing holes, the enclosure has fixing posts formed therein, the fixing holes correspondingly receive the fixing posts, the elastic sheet resists against the interface member.

17. The portable electronic device as claimed in claim 14, wherein the portable electronic device includes a sealing assembly sealing the gaps formed between the waterproof circuit board and the enclosure.

18. The portable electronic device as claimed in claim 17, wherein the sealing assembly includes an adhesive layer and a gasket overlapping on the adhesive layer.

19. The portable electronic device as claimed in claim 14, wherein the portable electronic device includes a conducting member to electronically connect the waterproof circuit board and the main circuit board.

\* \* \* \* \*